US010520263B2

(12) United States Patent
Lohan et al.

(10) Patent No.: US 10,520,263 B2
(45) Date of Patent: Dec. 31, 2019

(54) APPARATUS, SYSTEM, AND METHOD FOR INTERIOR FLUID FLOW WITH OPTIMIZED FIN STRUCTURES

(71) Applicant: TOYOTA MOTOR ENGINEERING & MANUFACTURING NORTH AMERICA, INC., Erlanger, KY (US)

(72) Inventors: Danny J. Lohan, Champaign, IL (US); Ercan M. Dede, Ann Arbor, MI (US)

(73) Assignee: TOYOTA MOTOR ENGINEERING & MANUFACTURING NORTH AMERICA, INC., Erlanger, KY (US)

( * ) Notice: Subject to any disclaimer, the term of this patent is extended or adjusted under 35 U.S.C. 154(b) by 0 days.

(21) Appl. No.: 15/710,321

(22) Filed: Sep. 20, 2017

(65) Prior Publication Data

US 2019/0086161 A1    Mar. 21, 2019

(51) Int. Cl.
*F28F 3/04*      (2006.01)
*F28F 27/02*     (2006.01)

(52) U.S. Cl.
CPC ............... *F28F 3/04* (2013.01); *F28F 27/02* (2013.01); *F28F 2200/00* (2013.01)

(58) Field of Classification Search
CPC ...... F28F 1/40; F28F 2200/00; F28F 2215/10; F28F 27/00; F28F 27/02; F28F 3/04; F28F 3/048; H01L 23/473
See application file for complete search history.

(56) References Cited

U.S. PATENT DOCUMENTS

| 5,655,599 | A | 8/1997 | Kasprzyk |
| 6,173,758 | B1 | 1/2001 | Ward et al. |
| 7,128,140 | B2 | 10/2006 | Barmoav et al. |
| 7,861,408 | B2 | 1/2011 | Thors |
| 9,677,823 | B2 * | 6/2017 | Schmid ................. F28F 13/06 |
| 9,844,165 | B2 * | 12/2017 | Sever ...................... F28F 3/022 |

(Continued)

FOREIGN PATENT DOCUMENTS

WO    2016/151442 A1    9/2016

OTHER PUBLICATIONS

Quadir, G. A., Anvar Mydin, and K. N. Seetharamu. "Analysis of microchannel heat exchangers using FEM." International Journal of Numerical Methods for Heat & Fluid Flow 11, No. 1 (2001): 59-76. (Year: 2001).*

(Continued)

*Primary Examiner* — Aniss Chad
(74) *Attorney, Agent, or Firm* — Oblon, McClelland, Maier & Neustadt, L.L.P.

(57) ABSTRACT

A heat exchanging system includes one or more heat exchanging portions, wherein each heat exchanging portion includes an optimized internal fin structure. The optimization of the optimized internal fin structure includes receiving existing heat exchanging system information, analyzing exterior fluid flow around the one or more heat exchanging portions as a heat flux analysis, determining boundary conditions of a heat flux distribution based on the heat flux analysis, receiving material properties of the one or more heat exchanging portions, and designing the optimized internal fin structure based on the existing heat exchanging system information, the boundary conditions of the heat flux distribution, and the material properties of the one or more heat exchanging portions.

6 Claims, 11 Drawing Sheets

(56) References Cited

U.S. PATENT DOCUMENTS

| | | |
|---|---|---|
| 2012/0006523 A1 | 1/2012 | Masahiro et al. |
| 2012/0055657 A1 | 3/2012 | Moser et al. |
| 2013/0299145 A1* | 11/2013 | Lee .................. F28D 15/00 165/165 |
| 2014/0311725 A1* | 10/2014 | Balasubramanian ..... F28F 3/04 165/168 |
| 2017/0108291 A1 | 4/2017 | Antel, Jr. et al. |

OTHER PUBLICATIONS

Chen, Han-Taw, Shih-Ting Lai, and Li-Ying Haung. "Investigation of heat transfer characteristics in plate-fin heat sink." Applied Thermal Engineering 50, No. 1 (2013): 352-360. (Year: 2013).*

Soodphakdee, Denpong, Masud Behnia, and David Watabe Copeland. "A Comparison of Fin Geometries for Heatsinks in Laminar Forced Convection—Part I: Round, Elliptical, and Plate Fins in Staggered and In-Line Configurations." Int. J. Microcircuits Electron. Packag 24, No. 1 (2001): 68-76. (Year: 2001).*

* cited by examiner

APPARATUS, SYSTEM, AND METHOD FOR INTERIOR FLUID FLOW WITH OPTIMIZED FIN STRUCTURES

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

For electronics cooling, common solutions for heat sinks include a simple straight fin structure for the interior fluid flow passage of the heat sink. The electronics on the outer surfaces of the heat sink impart a heat flux which is then transferred to the internal fin structure via conduction. Heat is then removed from the system through internal fluid (e.g., air) flow over the fin structure. Heat exchanger fin designs for internal cooling can be used where hot fluid passes through an array of tubes cooled by cold fluid. In conventional heat exchanger design, the orientation and position of tubes with cold fluid is designed to increase the effectiveness of heat transfer. These tubes are typically selected from a standard catalog of available parts/geometries.

SUMMARY

The foregoing paragraphs have been provided by way of general introduction, and are not intended to limit the scope of the following claims. The described embodiments, together with further advantages, will be best understood by reference to the following detailed description taken in conjunction with the accompanying drawings.

According to embodiments of the disclosed subject matter, a heat exchanging system includes one or more heat exchanging portions, wherein each heat exchanging portion includes an optimized internal fin structure. The optimization of the optimized internal fin structure includes receiving existing heat exchanging system information, analyzing exterior fluid flow around the one or more heat exchanging portions as a heat flux analysis, determining boundary conditions of a heat flux distribution based on the heat flux analysis, receiving material properties of the one or more heat exchanging portions, and designing the optimized internal fin structure based on the existing heat exchanging system information, the boundary conditions of the heat flux distribution, and the material properties of the one or more heat exchanging portions.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
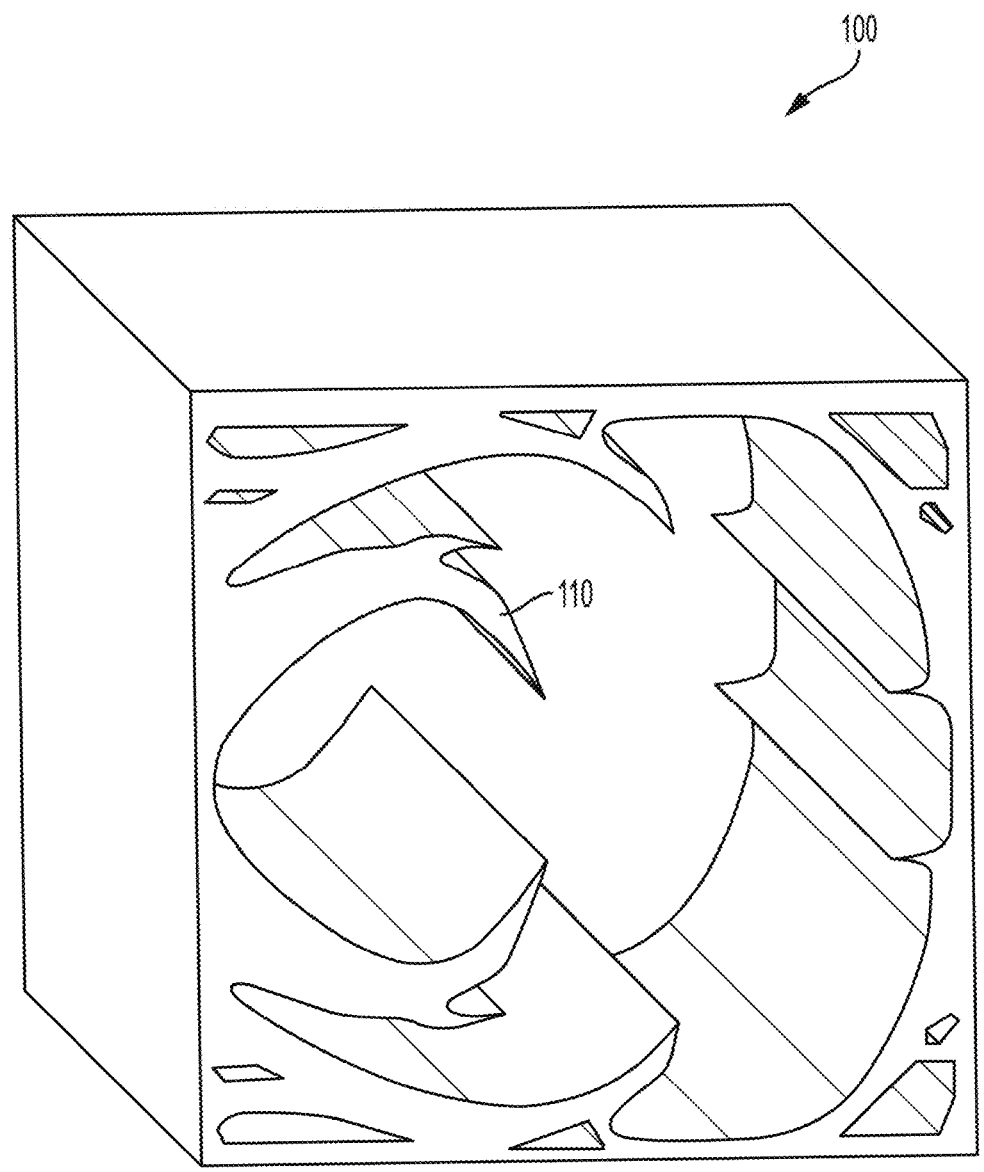
FIG. 1 depicts a perspective view of an exemplary heat sink according to one or more aspects of the disclosed subject matter.

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "left," "right," "top," "bottom," "front," "rear," "side," "height," "length," "width," "upper," "lower," "interior," "exterior," "inner," "outer," and the like that may be used herein, merely describe points of reference and do not necessarily limit embodiments of the disclosed subject matter to any particular orientation or configuration. Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

Referring now to the drawings, wherein like reference numerals designate identical or corresponding parts throughout the several views.

FIG. 1 depicts a perspective view of an exemplary heat exchanging component 100 according to one or more aspects of the disclosed subject matter. The heat exchanging component 100 can be a four-sided heat sink. However, it should be appreciated that the heat exchanging component 100 can have one or more sides. For example, the heat sink can be polygonal (e.g., triangular, square, hexagonal, octagonal, etc.), circular, or elliptical wherein the number of sides of a polygonal heatsink can be selected to match an electronics package solution. The heat exchanging component 100 can include an internal fin structure 110. The internal fin structure 110 can be optimized to improve performance based on a predetermined application of the heat exchanging component 100. For example, an optimized design of the internal fin structure 110 can achieve a substantially similar device temperature (i.e., the temperature of the device being cooled via the heat sink) with significantly less effort compared to a conventional fin structure (e.g., straight fins) as further described herein. In other words, the internal fin structure 110 can be designed based on an exterior heat flux distribution, thereby improving performance of the heat exchanging component 100 on a predetermined application basis.

Figure 2:
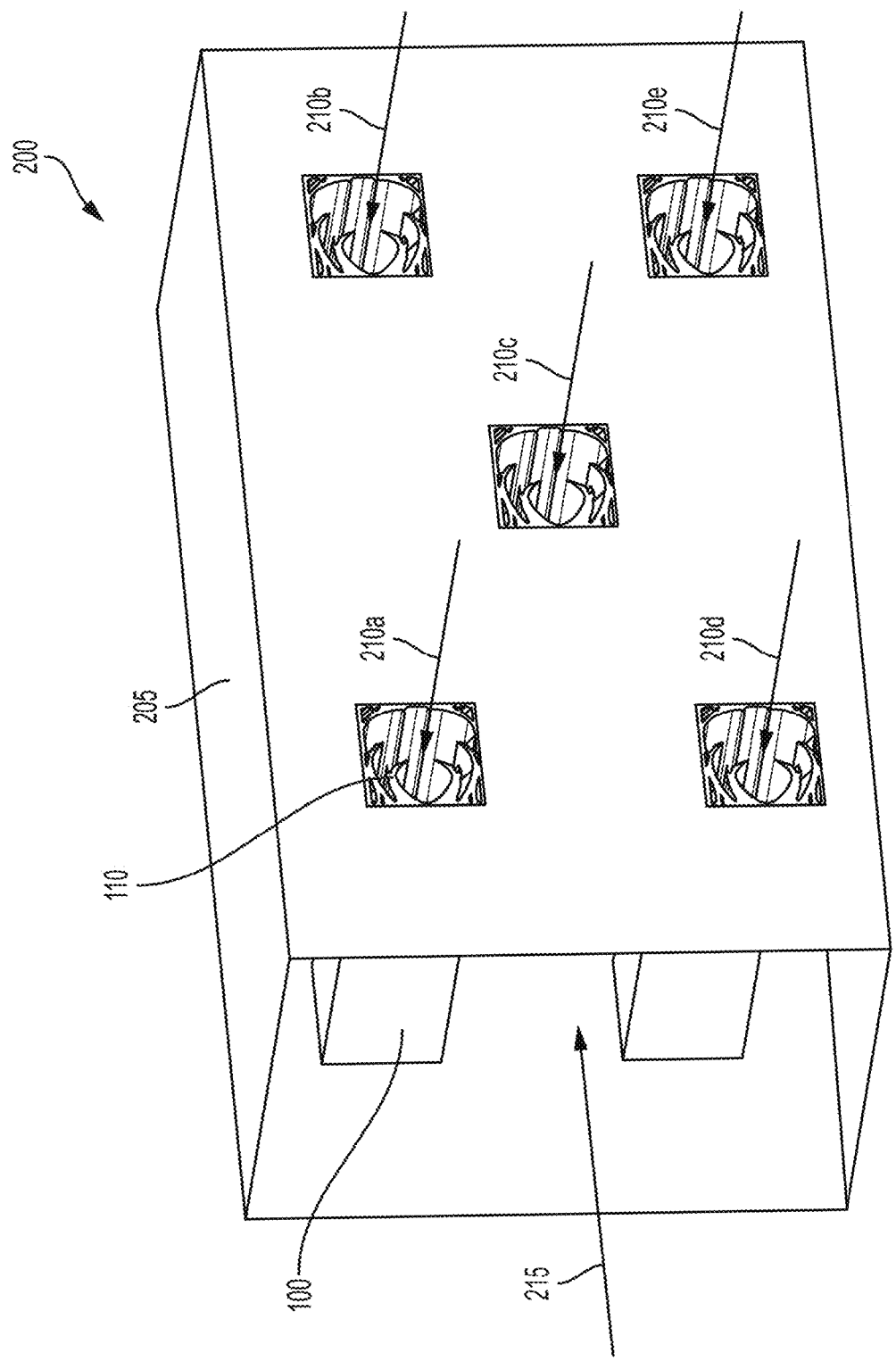
FIG. 2 depicts a perspective view of an exemplary heat sink system according to one or more aspects of the disclosed subject matter.

FIG. 2 depicts a perspective view of an exemplary heat sink system 200 according to one or more aspects of the disclosed subject matter. The heat sink system 200 can include a heat sink 205, wherein the heat sink 205 can include one or more heat exchanging components 100 that include an internal fin structure 110. The internal fin structure 110 can be an optimized internal fin structure as further described herein. In an embodiment, the heat sink system 200 can include a cooling component including cooled liquid (e.g., arrows 210a-e indicate a cooled fluid stream) that passes through the one or more heat exchanging components 100 to cool a higher temperature liquid (e.g., arrow 215 indicate a hot fluid stream) passing through the heat sink 205, for example. In an embodiment, the cooling component can be a fan which can be configured to cause air to flow through the heat exchanging component 100, for example. Additionally, the internal fin structure 110 can be configured to influence the air flowing through the heat exchanging component 100. In an embodiment, the cooling component can be configured to cause other fluid (e.g., water) to flow through the heat exchanging component 100.

FIGS. 3A-3H depict exemplary internal fin structure geometries for a heat sink according to one or more aspects of the disclosed subject matter. The exemplary internal fin structure geometries can be based on a uniform heat flux distribution on each exterior surface of the heat sink. For example, based on a heat sink exterior surface heat flux distribution, a heat transfer coefficient (h-value), and an internal channel fluid flow, various optimized heat sink fin structures may be designed (and manufactured based on the design) based on a gradiant-based structural optimization routine.

Figure 3A:
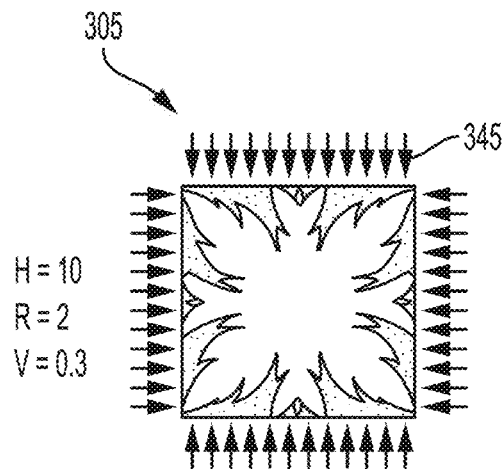
FIG. 3A depicts an exemplary internal fin structure geometry according to one or more aspects of the disclosed subject matter.
Figure 3B:
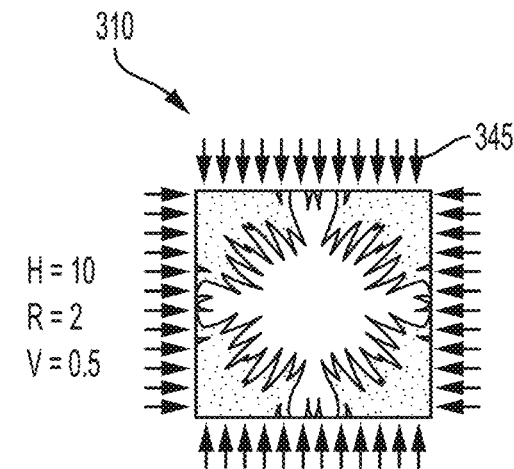
FIG. 3B depicts an exemplary internal fin structure geometry according to one or more aspects of the disclosed subject matter.
Figure 3C:
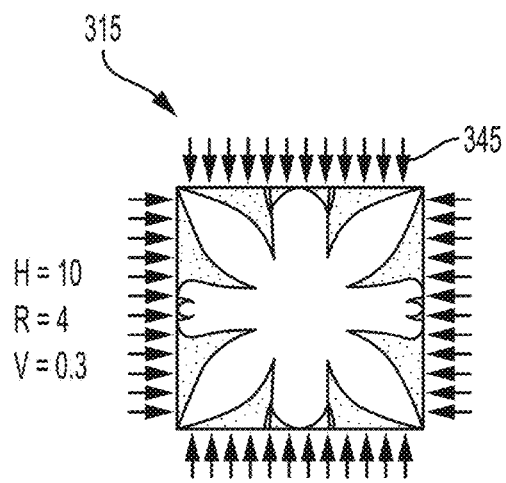
FIG. 3C depicts an exemplary internal fin structure geometry according to one or more aspects of the disclosed subject matter.
Figure 3D:
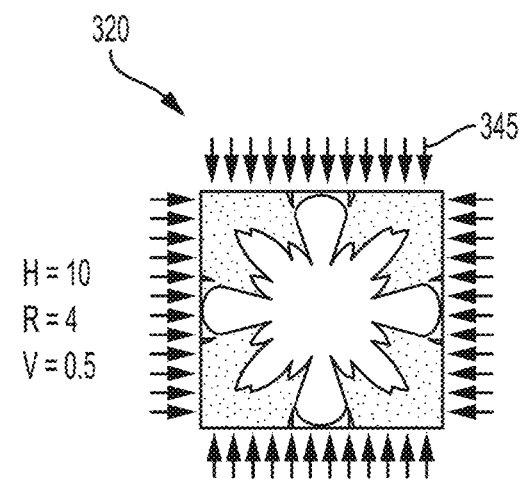
FIG. 3D depicts an exemplary internal fin structure geometry according to one or more aspects of the disclosed subject matter.

FIGS. 3A-3D depict optimized internal channel fin structures with a heat transfer coefficient (H or h-value) of 10 W/(m²-K) with different material volume constraints and filter radius to enforce a minimum structural length scale. More specifically, FIG. 3A can include an optimized internal fin structure 305 with a uniform heat flux 345. The optimized internal fin structure 305 can be based on an h-value of 10 W/(m²-K), a filter radius (R) of 2, and a material volume constraint (V) of 0.3. V represents a volume fraction. For example, 0.3 refers to the percentage of the domain, 30%, that is solid. The filter radius, R, refers to the minimum thickness of a designed solid feature. This can also be scaled as a percentage of the domain, such as 2% (2 of 100), for example. FIG. 3B can include an optimized internal fin structure 310 with a uniform heat flux 345. The optimized internal fin structure 310 can be based on an h-value of 10 W/(m²-K), a filter radius of 2, and a material volume constraint of 0.5. FIG. 3C can include an optimized internal fin structure 315 with a uniform heat flux 345. The optimized internal fin structure 315 can be based on an h-value of 10 W/(m²-K) a filter radius of 4, and a material volume constraint of 0.3. FIG. 3D can include an optimized internal fin structure 320 with a uniform heat flux 345. The optimized internal fin structure 320 can be based on an h-value of 10 W/(m²-K), a filter radius of 4, and a material volume constraint of 0.5.

Figure 3E:
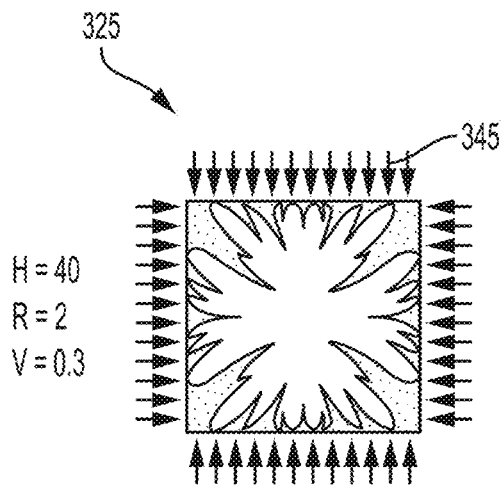
FIG. 3E depicts an exemplary internal fin structure geometry according to one or more aspects of the disclosed subject matter.
Figure 3F:
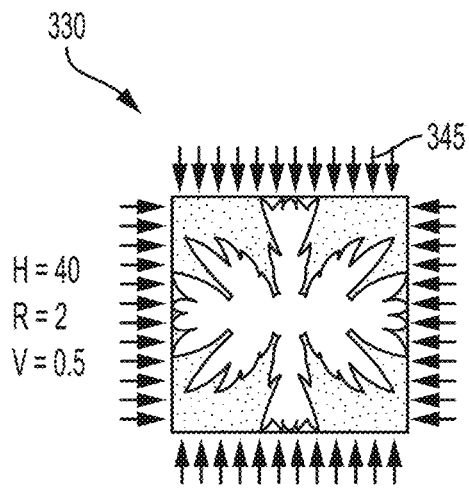
FIG. 3F depicts an exemplary internal fin structure geometry according to one or more aspects of the disclosed subject matter.
Figure 3G:
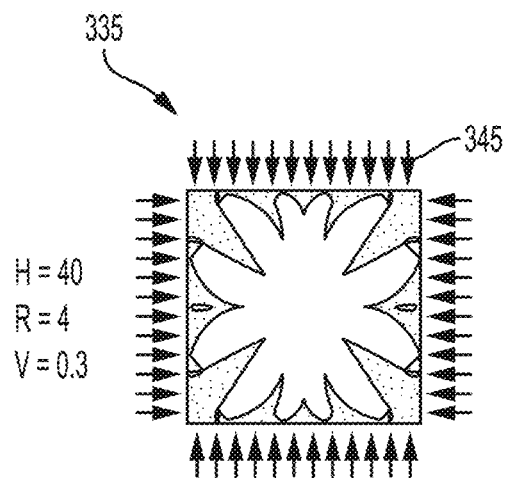
FIG. 3G depicts an exemplary internal fin structure geometry according to one or more aspects of the disclosed subject matter.
Figure 3H:
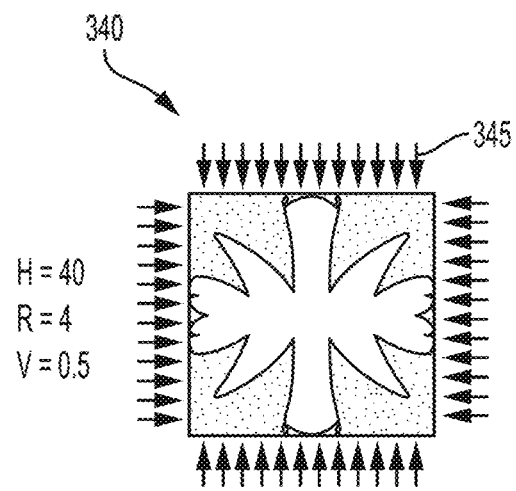
FIG. 3H depicts an exemplary internal fin structure geometry according to one or more aspects of the disclosed subject matter.

FIGS. 3E-3G depict optimized internal channel fin structures with an h-value of 40 W/(m²-K) (i.e., a higher interior flow rate compared to 10 W/(m²-K)) with different material volume constraints and filter radius to enforce a minimum structural length scale. More specifically, FIG. 3E can include an optimized internal fin structure 325 with a uniform heat flux 345. The optimized internal fin structure 325 can be based on an h-value of 40 W/(m²-K) a filter radius of 2, and a material volume constraint of 0.3. FIG. 3F can include an optimized internal fin structure 330 with a uniform heat flux 345. The optimized internal fin structure 330 can be based on an h-value of 40 W/(m²-K), a filter radius of 2, and a material volume constraint of 0.5. FIG. 3G can include an optimized internal fin structure 335 with a uniform heat flux 345. The optimized internal fin structure 335 can be based on an h-value of 40 W/(m²-K), a filter radius of 4, and a material volume constraint of 0.3. FIG. 3H can include an optimized internal fin structure 340 with a uniform heat flux 345. The optimized internal fin structure 340 can be based on an h-value of 40 W/(m²-K), a filter radius of 4, and a material volume constraint of 0.5.

In an embodiment, each uniform heat flux 345 can be a heat sink exterior surface heat flux distribution, for example.

Figure 4A:
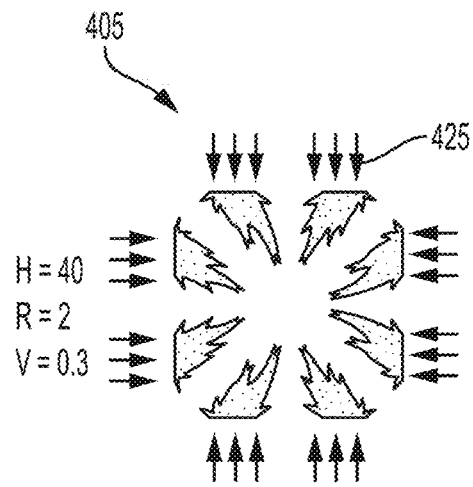
FIG. 4A depicts an exemplary internal fin structure geometry according to one or more aspects of the disclosed subject matter.
Figure 4B:
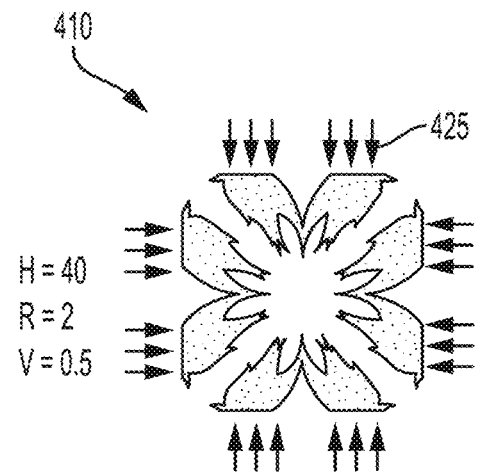
FIG. 4B depicts an exemplary internal fin structure geometry according to one or more aspects of the disclosed subject matter.
Figure 4C:
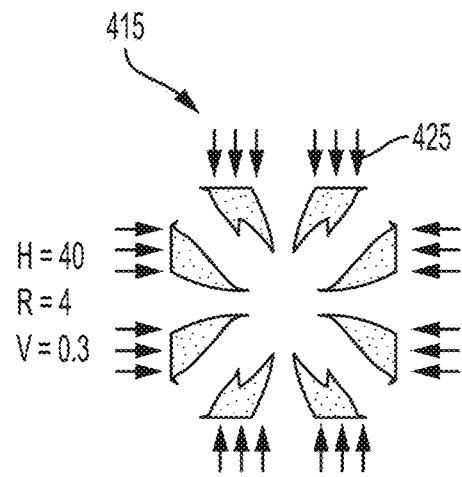
FIG. 4C depicts an exemplary internal fin structure geometry according to one or more aspects of the disclosed subject matter.
Figure 4D:
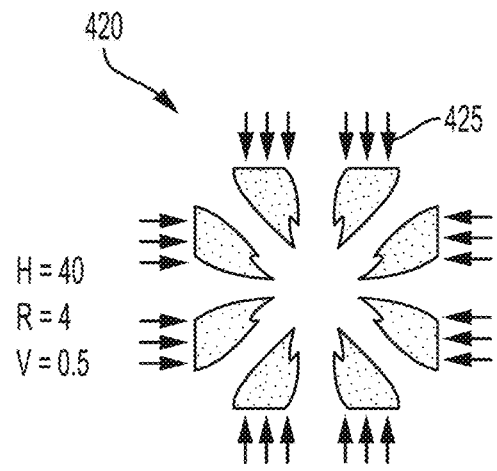
FIG. 4D depicts an exemplary internal fin structure geometry according to one or more aspects of the disclosed subject matter.

FIGS. 4A-4D depict exemplary internal fin structure geometries according to one or more aspects of the disclosed subject matter. The exemplary internal fin structure geometries can be based on a non-uniform heat flux distribution on each exterior surface of the heat sink. For example, based on a heat sink exterior surface heat flux distribution, a heat transfer coefficient (h-value), and an internal channel fluid flow, various optimized heat sink fin structures may be designed (and manufactured based on the design) based on a gradiant-based structural optimization routine. More specifically, FIG. 4A can include an optimized internal fin structure 405 with a non-uniform heat flux 425. The optimized internal fin structure 405 can be based on an h-value of 40 W/(m²-K), a filter radius (R) of 2, and a material volume constraint (V) of 0.3. FIG. 4B can include an optimized internal fin structure 410 with a non-uniform heat flux 425. The optimized internal fin structure 410 can be based on an h-value of 40 W/(m²-K), a filter radius of 2, and a material volume constraint of 0.5. FIG. 4C can include an optimized internal fin structure 415 with a uniform heat flux 425. The optimized internal fin structure 415 can be based on an h-value of 40 W/(m²-K), a filter radius of 4, and a material volume constraint of 0.3. FIG. 4D can include an optimized internal fin structure 420 with a uniform heat flux 425. The optimized internal fin structure 420 can be based on an h-value of 40 W/(m²-K), a filter radius of 4, and a material volume constraint of 0.5.

In an embodiment, each non-uniform heat flux 425 can be a heat sink exterior surface heat flux distribution imparted, for example, by an electronics device or similar discrete beat source.

It should be appreciated that FIGS. 3A-3G and FIGS. 4A-4D are exemplary and optimizing the internal fin structure can be done for any h-value, filter radius, and material volume constraint.

In an embodiment, the optimized internal fin structures can be applied as electronics heat sinks, for example.

Figure 5:
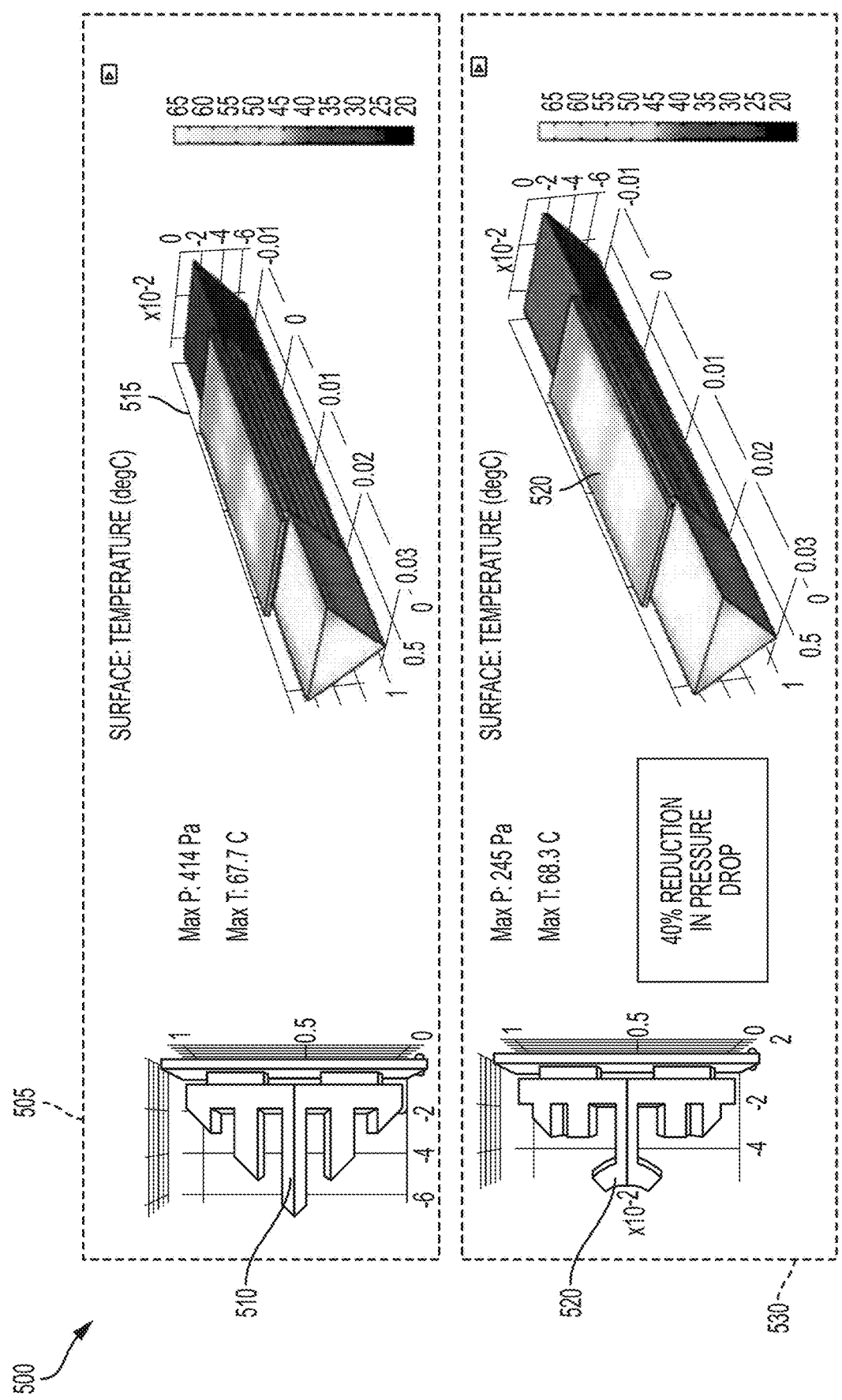
FIG. 5 depicts an exemplary conjugate heat transfer analysis according to one or more aspects of the disclosed subject matter.

FIG. 5 depicts an exemplary conjugate heat transfer analysis 500 according to one or more aspects of the disclosed subject matter. The conjugate heat transfer analysis 500 can include comparing a first heat transfer analysis 505 and a second heat transfer analysis 530. The first heat transfer analysis 505 can include a ¼-symmetry model of a conventional internal fin structure 510. The first heat transfer analysis 505 and corresponding surface temperature visual 515 can correspond to a maximum pressure drop (Max ΔP) of 414 pascals (Pa) and a maximum temperature (Max T) of 67.7° C. The second heat transfer analysis 530 can include a ¼-symmetry model of an optimized internal fin structure 520. The second heat transfer analysis 530 and corresponding surface temperature visual 525 can correspond to a maximum pressure drop of 245 Pa and a maximum temperature of 68.3° C. The heat transfer analysis 500 can illustrate the effectiveness of optimized internal fin structures (e.g., as shown in FIGS. 3A-3G and FIGS. 4A-4D). For example, the optimized internal fin structure 520 can achieve substantially the same device temperature (e.g., within one degree) with a 40% reduction in pressure drop (assuming the same air flow rate for the direct comparison), wherein the pressure drop can correspond to pumping power (e.g., when pumping air via a fan). It should he appreciated that the device temperature can refer to any device that the heat sink is being used to cool, for example.

Figure 6:
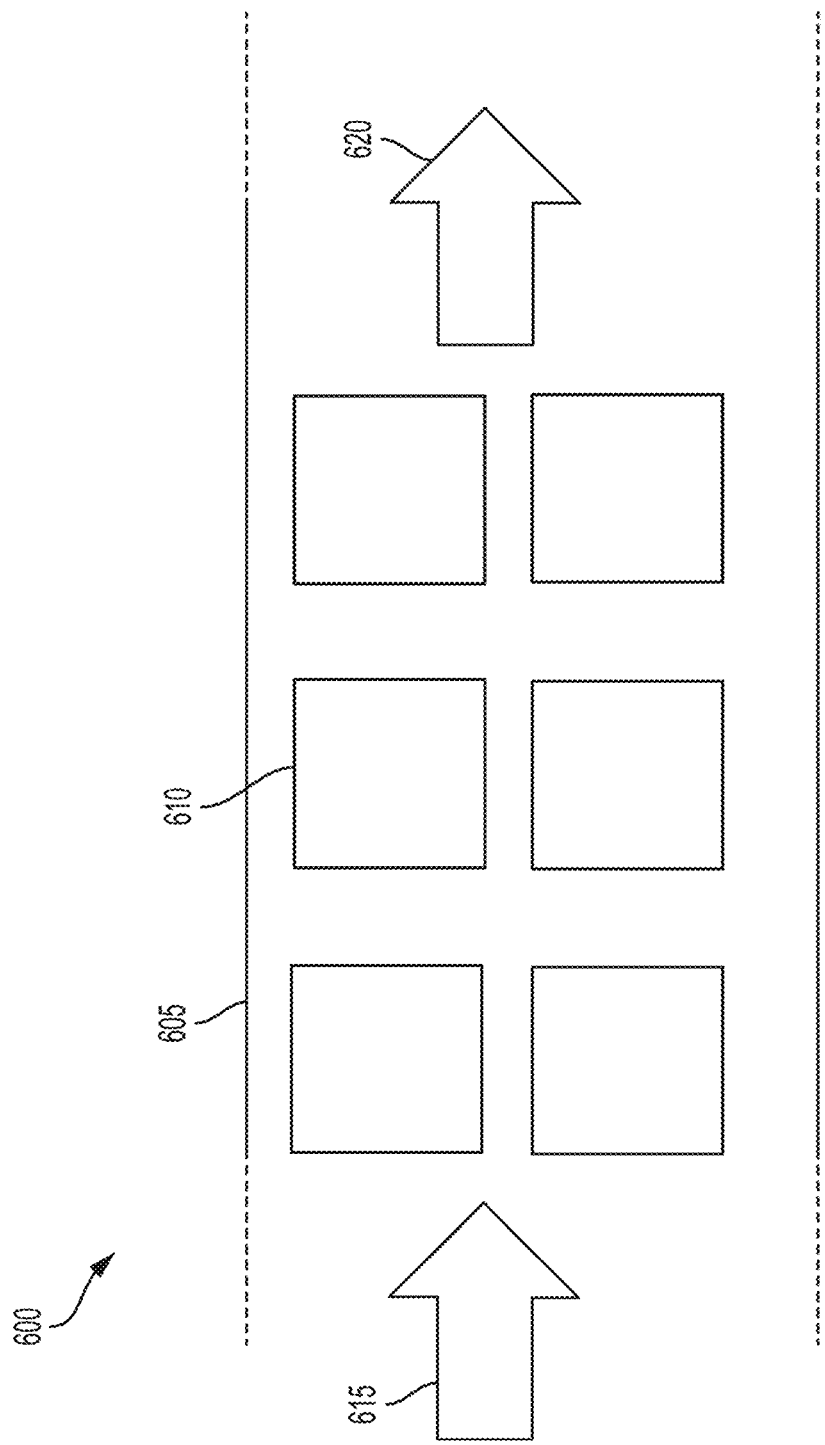
FIG. 6 depicts an exemplary heat exchanger system according to one or more aspects of the disclosed subject matter.

FIG. 6 depicts an exemplary heat exchanger system 600 according to one or more aspects of the disclosed subject matter. In an embodiment, the heat exchanger system 600 can include fluid contained in a container 605. The heat exchanger system 600 can include hot fluid indicated by arrow 615, wherein the hot fluid is also moving in a direction indicated by arrow 615, passing over beat exchanging components 610 configured to cool the hot fluid to generate cold fluid indicated by arrow 620, wherein the cold fluid is also moving in a direction indicated by arrow 620. The heat exchanging components 610 can include one or more heat exchanging components, for example. Each heat exchanging component 610 can include an optimized internal fin structure based on a heat flux distribution of the fluid flow over the heat exchanging component 610. In an embodiment, each of the heat exchanging components 610 can include the same optimized internal fin structure. Alternatively, each heat exchanging component 610 can include a different optimized internal fin structure based on a unique heat flux distribution of the fluid flow over the heat exchanging component 610 corresponding to the position of the heat exchanging component 610. For example, a first heat exchanging component 610 may alter a portion of the fluid flow, thereby altering how the fluid flow passes over a subsequent heat exchanging component. As a result, the optimized internal fin structure of the subsequent heat exchanging component may be different than the optimized internal fin structure of the first heat exchanging component. Additionally, each heat exchanging component 610 may be placed in a predetermined location within the fluid flow to further optimize the heat exchange, and the fluid flow relative to the position of each heat exchanging component can be included in determining the optimized internal fin structure of each heat exchanging component 610.

Figure 7:
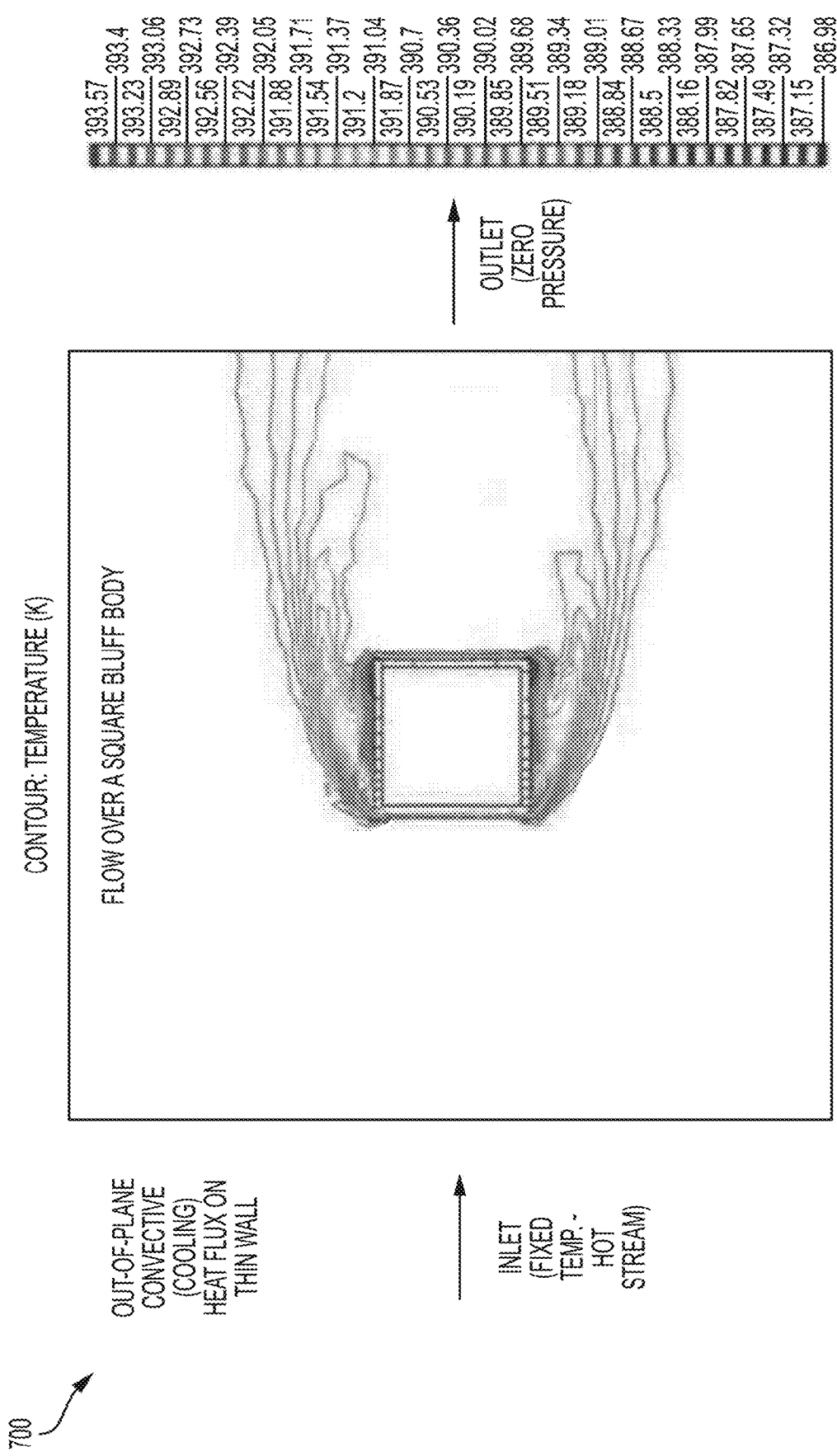
FIG. 7 depicts an exemplary heat flux analysis according to one or more aspects of the disclosed subject matter.

FIG. 7 depicts an exemplary heat flux analysis 700 according to one or more aspects of the disclosed subject matter. FIG. 7 presents an exemplary numerical simulation where a heat exchanging component can be used to cool hot liquid passing from left to right, for example. The heat exchanging component can be a square tube. However, it should be appreciated that any shape can be used for the simulation, and the simulation can be performed based on the shape of the heat exchanging component being analyzed. The heat flux analysis 700 can show a variation in the heat flux experienced on the perimeter of the heat exchanging component. For example, the heat flux analysis 700 for the square tube can show heat flux on four sides (e.g., the four sides that the fluid will interact with) of the heat exchanging component. More specifically, the heat flux analysis 700 can determine that the heat flux is about 10 W/m² at a front, 1 W/m² on a first and second side (i.e., top and bottom with respect to the square tube in FIG. 7), and 5 W/m² on a back of the heat exchanging component.

Figure 8:
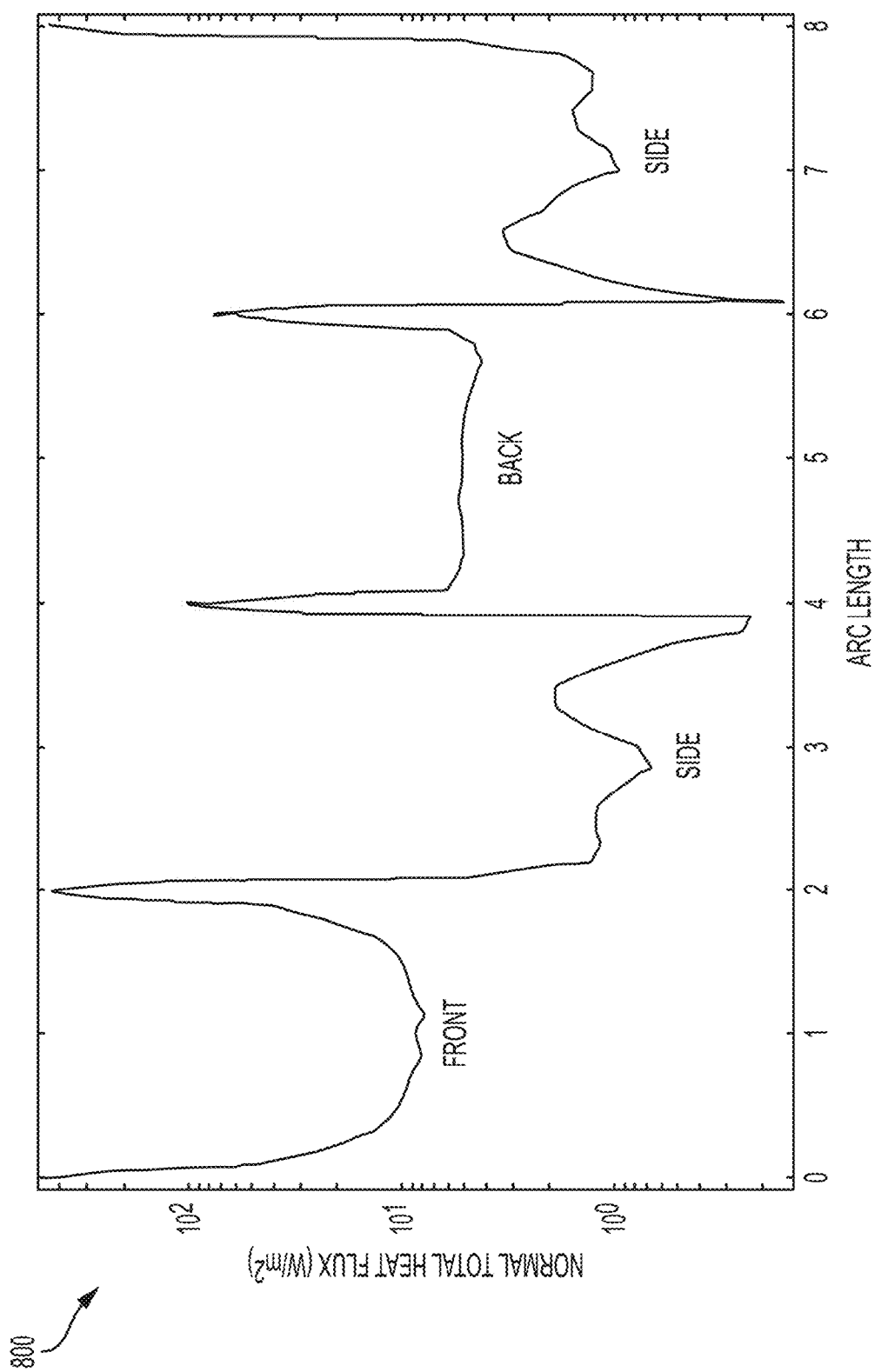
FIG. 8 depicts an exemplary heat flux distribution graph according to one or more aspects of the disclosed subject matter.

FIG. 8 depicts an exemplary heat flux distribution graph 800 according to one or more aspects of the disclosed subject matter. The heat flux distribution graph 800 can correspond to non-uniform heat flux distribution due to air flow over the four sides of the square tube as shown in FIG. 7. The heat flux distribution graph 800 can indicate arc length vs. normal total heat flux (W/m²). For example, the heat flux corresponding to the front, sides, and back of the heat exchanging component as simulated in FIG. 7 can be displayed in a graph format. Based on the heat flux experience on each boundary, an optimization calculation can he performed to maximize the heat transfer rate from the internal fluid.

Figure 9:
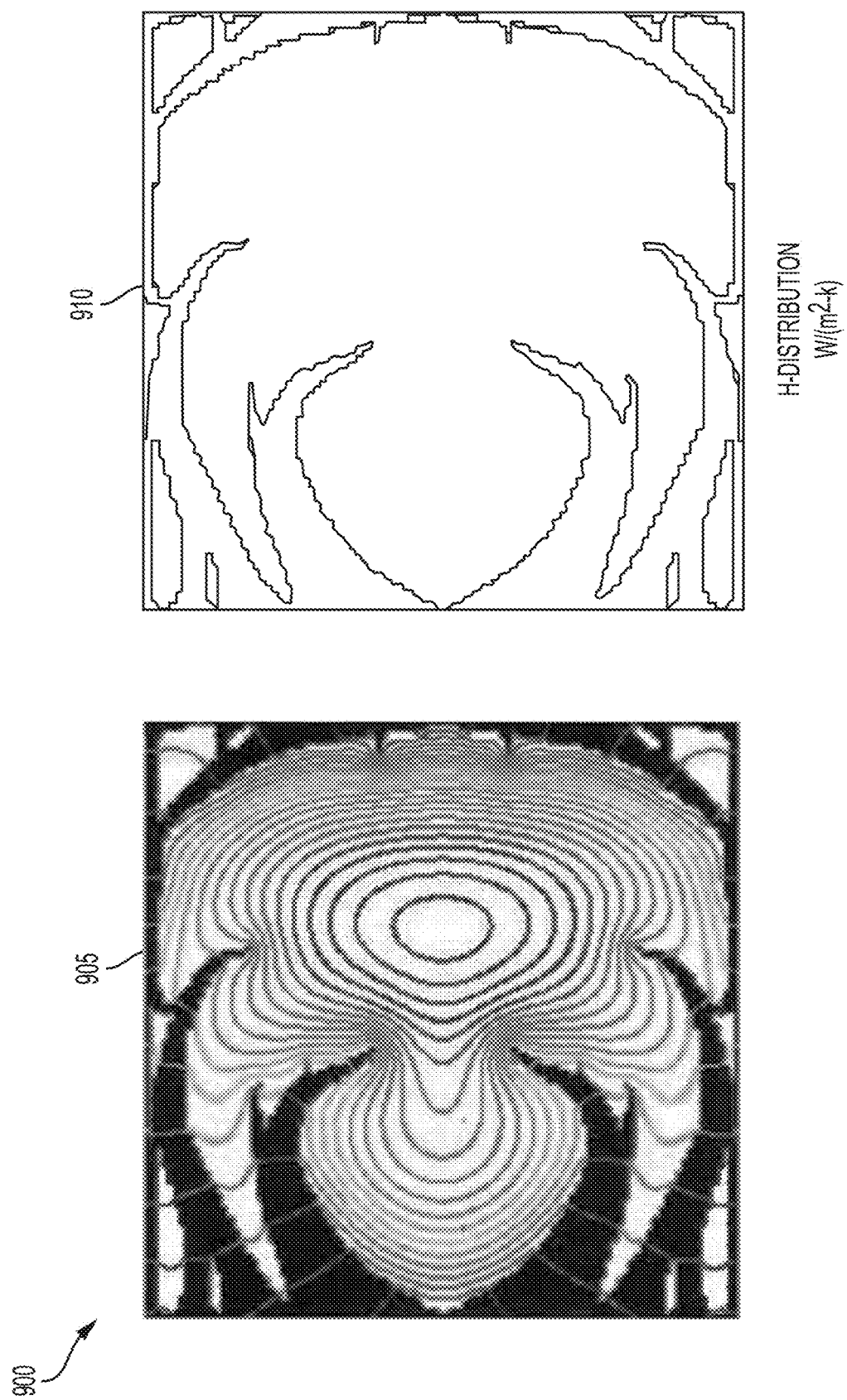
FIG. 9 depicts an exemplary optimized internal fin structure for a heat exchanging component according to one or more aspects of the disclosed subject matter.

FIG. 9 depicts an exemplary optimized internal fin structure 900 for a heat exchanging component according to one or more aspects of the disclosed subject matter. The optimized internal fin structure 900 for the heat exchanging component (e.g., the heat exchanging component from the heat flux analysis 700) can account for the variation in heat flux around the heat exchanging component. Optimization result 905 can correspond to an optimization result for optimal internal fin structure using the prior solved-for heat flux distribution. H-distribution 910 can indicate the full magnitude value of the optimization result.

It should be appreciated that the simulation and subsequent design and generation of an optimized internal fin structure as describe in FIG. 7, FIG. 8, and FIG. 9 are exemplary and can be performed for heat exchanging components where the inputs for the simulation and optimization can be based on various shapes in various heat exchanging systems and applications.

Figure 10:
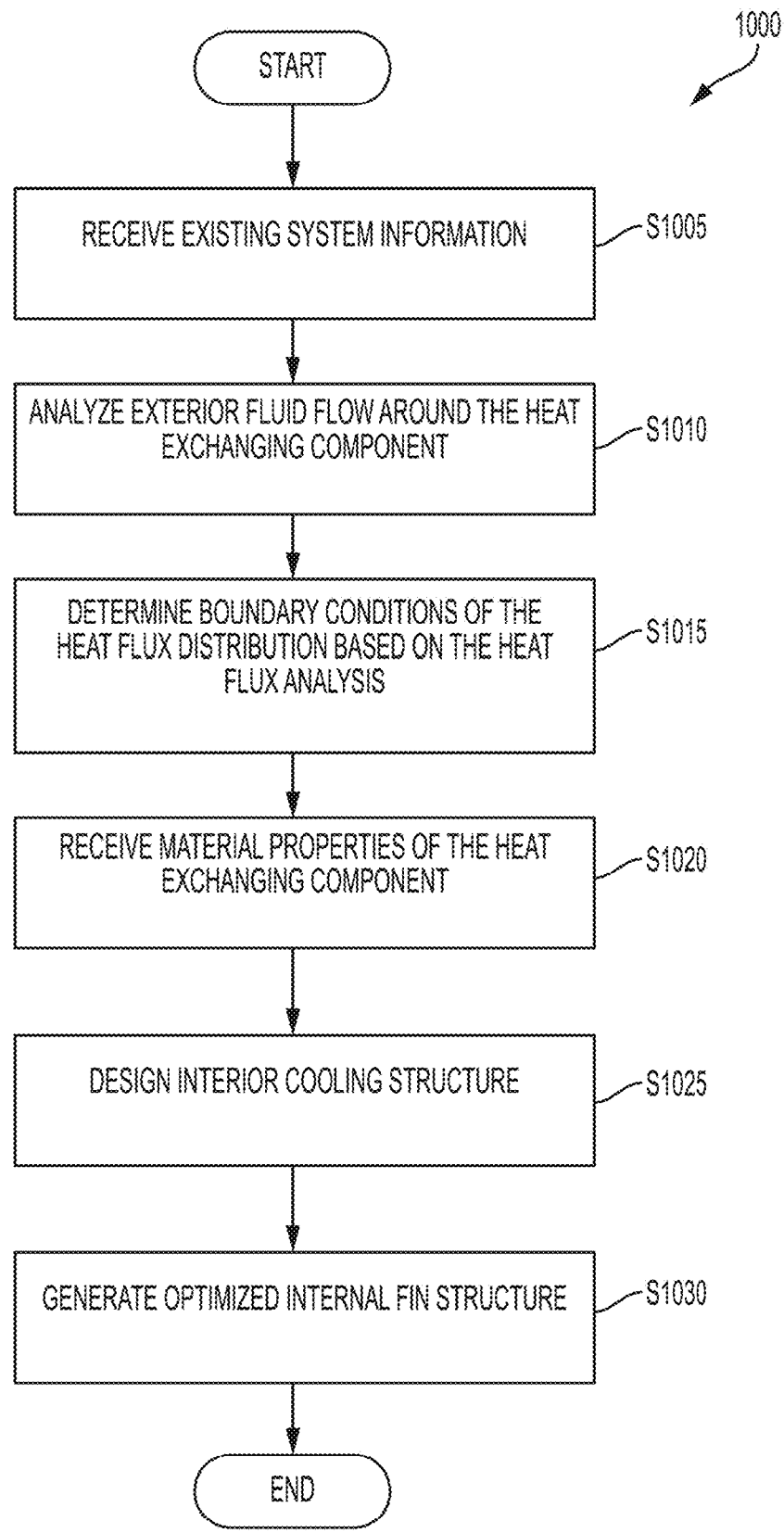
FIG. 10 is an exemplary workflow for generating an optimized internal fin structure for a heat exchanging component according to one or more aspects of the disclosed subject matter.

FIG. 10 is an exemplary workflow 1000 for generating an optimized internal fin structure for a heat exchanging component according to one or more aspects of the disclosed subject matter. In an embodiment, at least a portion of the exemplary workflow can be performed via processing circuitry. The processing circuitry can carry out instructions to perform or cause performance of various functions, operations, steps or processes of the workflow.

In S1005, existing system information can be received. Existing system information can include geometric information of flow domain, location of heat sources, magnitude of heat sources, solid material properties, fluid properties, flow properties, and the like.

In S1010, exterior fluid flow around the heat exchanging component can be analyzed. For example, the exterior fluid flow around one or more of the heat exchanging components 610 can be analyzed as described in FIG. 7.

In S1015, boundary conditions of the heat flux distribution can be determined based on a heat flux analysis of the heat exchanging component. For example, the boundary conditions of the heat exchanging component can be determined as described in FIG. 8, wherein the boundary conditions of the heat exchanging component determined in FIG. 8 can be based on the heat flux analysis of the heat exchanging component as described in FIG. 7.

In S1020, material properties of the heat exchanging component can be received. For example, the heat exchanging component can be made of copper, aluminum, silver, and the like. The material of the heat exchanging component can be significant in the calculation of the optimization for the optimized internal fin structure based on how well the material. conducts heat, for example. More specifically, non-straight, functionally distributed heat sink and/or heat exchanger interior fin structures can be fabricated out of thermal conductivity enhanced plastic materials or metals using either a traditional machining or an additive manufacturing method, for example.

In S1025, an interior cooling structure can be designed, wherein designing the interior cooling structure can include calculating an optimization for the internal fin structure of the heat exchanging component.

In S1030, an optimized internal fin structure for a heat exchanging component can be generated. Generating the optimized internal fin structure can include a digital drawing, a 3D rendering, a 3D printing, and/or manufacturing a physical heat exchanging component with the optimized internal fin structure.

It should be appreciated that the workflow 1000 can similarly be applied to optimizing the internal fin structure for an electronics heat sink, for example, where discrete heat sources are more typical.

The optimized internal fin structure can include various advantages including providing enhanced thermal-fluid performance based on a non-uniform exterior surface heat flux distribution. In other words, by customizing the interior channels based on the exterior heat flux distribution, we can design customized heat sinks and heat exchanger tubes for improved performance on an application basis.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

The invention claimed is:

1. A method, comprising:
receiving existing heat exchanging system information;
analyzing exterior fluid flow over an exterior surface of one or more heat exchanging structure as a heat flux analysis, the one or more heat exchanging structure including an aperture through which an interior fluid is passable and including an internal fin that projects into the interior fluid;
determining, via processing circuitry, boundary conditions of a heat flux distribution based on the heat flux analysis;
receiving material properties of the one or more heat exchanging structure; and
designing an optimized structure of the internal fin based on the existing heat exchanging system information, the boundary conditions of the heat flux distribution, and the material properties of the one or more heat exchanging structure.

2. The method of claim 1, wherein the one or more heat exchanging structure is polygonal, circular, or elliptical.

3. The method of claim 1, wherein the existing heat exchanging system information includes geometric information of flow domain, location of heat sources, magnitude of heat sources, solid material properties, fluid properties, and flow properties.

4. The method of claim 1, wherein the heat flux distribution is non-uniform.

5. The method of claim 1, wherein the optimized structure of the internal fin is non-straight.

6. The method of claim 1, wherein the optimized internal fin structure is fabricated out of thermal conductivity enhanced plastic materials or metals.

* * * * *